Dec. 13, 1966 R. J. DENEEN, JR 3,292,096

LINEAR, AUTOMATIC GAIN CONTROL AMPLIFIER

Filed May 11, 1964 2 Sheets-Sheet 1

INVENTOR.
Raymond J. Deneen, Jr.
BY
H. H. Losche
Att'ys.

LINEAR, AUTOMATIC GAIN CONTROL AMPLIFIER

Filed May 11, 1964 2 Sheets-Sheet 2

INVENTOR.
Raymond J. Deneen, Jr.
BY
H. H. Losche
Att'ys.

United States Patent Office 3,292,096

Patented Dec. 13, 1966

3,292,096
LINEAR, AUTOMATIC GAIN CONTROL AMPLIFIER

Raymond J. Deneen, Jr., Baltimore, Md., assignor, by mesne assignments, to the United States of America as represented by the Secretary of the Navy

Filed May 11, 1964, Ser. No. 366,670
6 Claims. (Cl. 330—29)

This invention relates to amplifiers and more particularly to transistor amplifiers having high sensitivity, large gain, good linearity, and a "slow" automatic gain control (AGC) for amplifying voltage signals for data handling or logic circuit equipment of radar systems, or the like.

Video amplifiers are increasingly employed in conjunction with bolometers, or the like, to enable data handling portions of a system to operate upon the information contained in the radio frequency levels of the system. In such an application the video amplifier characteristcis should be compatible with those of the bolometer, namely low level signal, large dynamic range, and good linearity as well as with those of the logical elements in the data handling equipment.

In the present invention an AGC amplifier that can be used with a bolometer has a variable voltage divider circuit which includes a transistor employed as the variable impedance element. The output of the voltage divider circuit is coupled to the first of several stages of cascaded transistors and the last stage is a transistor amplifier and a emitter follower combination. An AGC feedback from the cathode follower output of the amplifier to the base of the voltage divider transistor impedance element controls the impedance of the transistor and, consequently, the voltage division of the variable divider circuit. An input signal to the voltage divider circuit is controlled in its input to the amplifier stages where the signal is inverted to control the gain of the amplifiers inversely with amplification providing AGC. The feedback circuit has a feedback clamp to shift the feedback voltage to a desired level and also has a peak detector to convert the feedback voltage to a direct current (D.C.) level. The output of the amplifier is also clamped at a voltage most adaptable for the circuitry to which it is applied, such as to an input of a data handling device. The cascaded transistor circuits in the amplifier provide high input impedance and attains a one percent linearity for amplified signals. This is a series attenuator type of AGC which provides good voltage sentivity, high voltage gain, and a "slow" AGC of about 34 decibels (db). It is therefore a general object of this invention to provide an AGC amplifier using a feedback clamp and a peak detector in the AGC control feedback circuit and using cascaded transistor amplifier stages to produce high sensitivity, large gain, good linearity, and a "slow" AGC of about 34 db.

Figure 1:
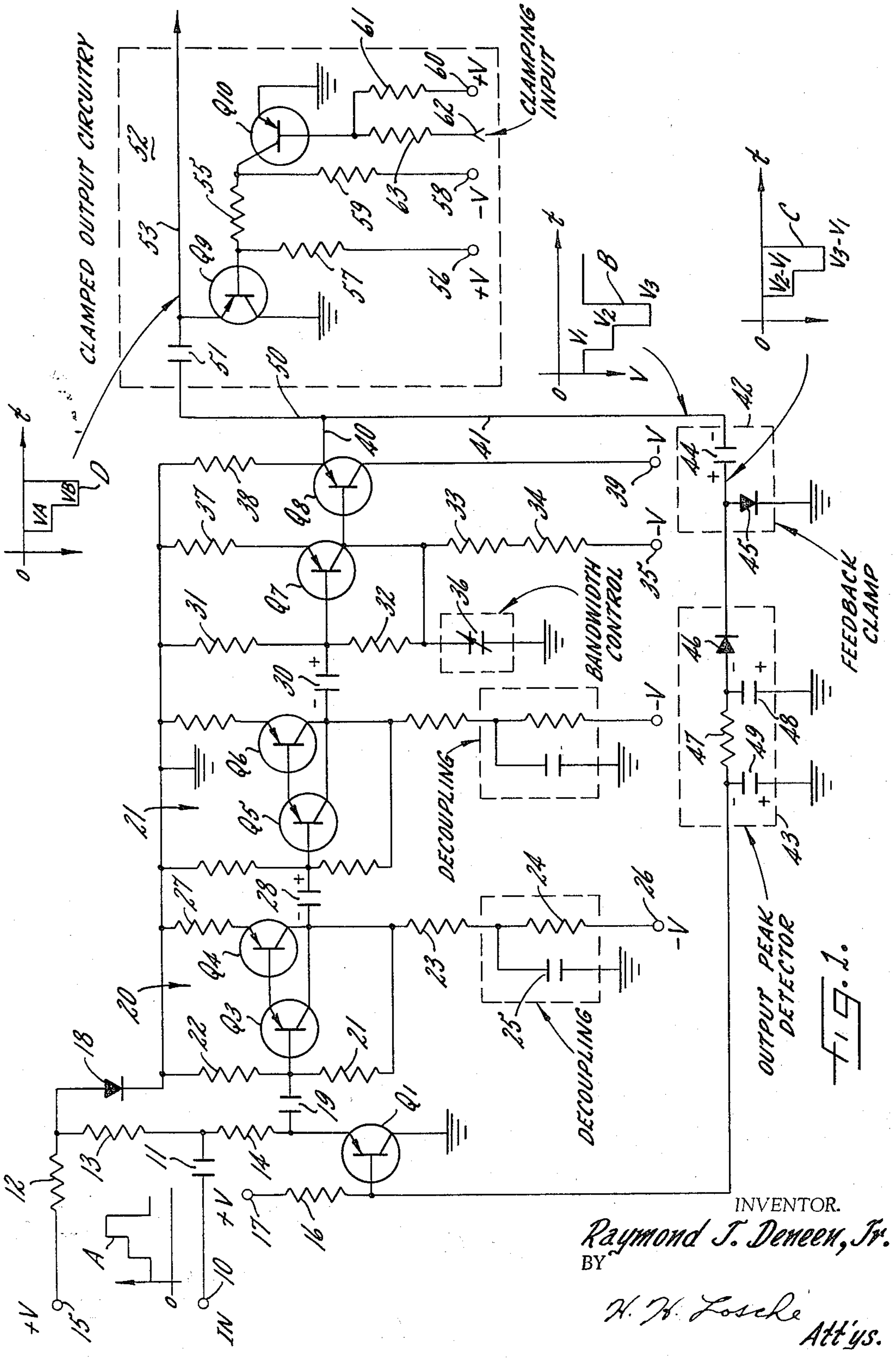
Figure 2:
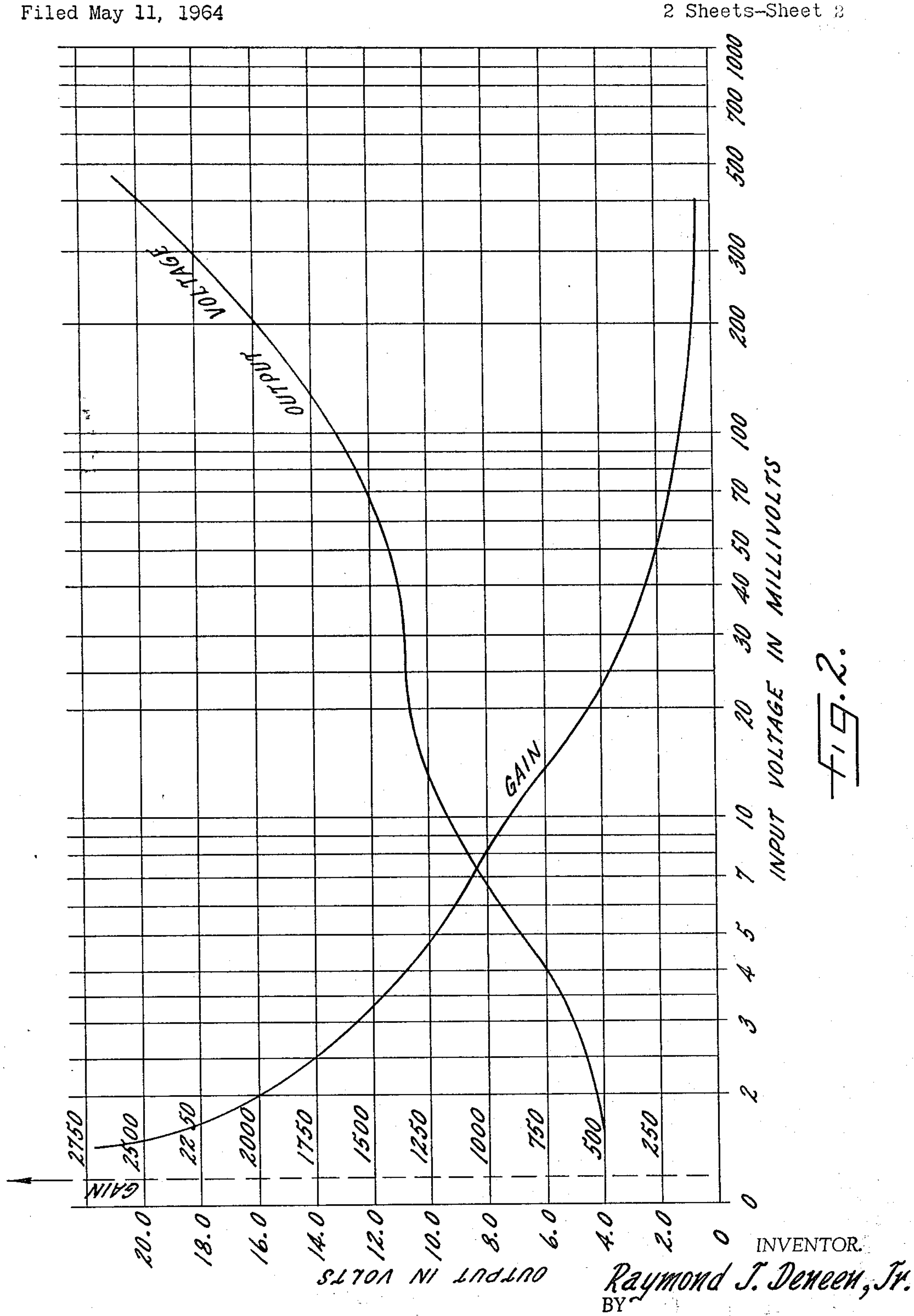

These and other objects and the attendant advantages, features, and uses will become more apparent to those of ordinary skill in the art when considered along with the accompanying drawings in which:

FIGURE 1 is a circuit schematic of the linear, AGC amplifier of this invention; and FIGURE 2 is a graph of the variation of output voltage and gain as a function of the input voltage.

Referring more particularly to FIGURE 1, input voltage signals, such as A, are applied to an input terminal 10 and through a coupling capacitor 11 to a variable voltage divider circuit consisting of resistors 12, 13, and 14 in series from a positive voltage source 15 through the emitter and collector of a transistor Q1 to the opposite pole of the voltage source. Transistor Q1 constitutes the variable impedance portion of the variable voltage divider. The junction of resistors 12 and 13 is coupled to the anode of a diode 18 having its cathode grounded. The base electrode of transistor Q1 is biased through a biasing resistor 16 from a positive voltage source at terminal 17 to hold the transistor Q1 off until the signal at the output of the amplifier becomes large enough to turn the transistor Q1 on. The input voltage signal A is illustrated as being a stepped voltage employed in the use of data handling equipment, as is well understood by those skilled in the art. This input through the coupling capacitor 11 is to the junction of resistors 13 and 14 in the variable voltage divider circuit 12 through 14 and Q1. The output of the variable voltage divider circuit is from the emitter of transistor Q1 through a coupling capacitor 19.

The output of the variable voltage divider circuit is coupled as an input to the first of two cascaded transistor amplifier circuits 20 and 21, often referred to in textbooks as composite transistor circuits and similar to "Darlington" circuit which originated from the Darlington U.S. Patent Number 2,663,806. The composite transistor amplifier circuit 20 consists of two PNP transistors Q3 and Q4 with the base of transistor Q4 coupled to the emitter of transistor Q3 and the collectors coupled in common. The composite transistor circuits combine two or more transistors such that a base, an emitter, and collector electrodes are available for coupling to outside circuitry the same as a single transistor. The base of transistor Q3 is coupled through a resistor 21 to the common collector coupling and through a resistor 22 to a fixed potential, such as ground, to produce a base biasing voltage on the composite transistors Q3 and Q4. The common collector coupling is connected through a resistor 23 and a decoupling network, consisting of a resistor 24 and capacitor 25, to a negative voltage source at terminal 26. The emitter of transistor Q4 is coupled through a resistor 27 to the fixed or ground potential producing the emitter-collector voltage across the composite transistors Q3 and Q4. This composite transistor circuit 20 has an output taken from the common coupling of the collectors through a coupling capacitor 28 to the second composite transistors circuit 21, this latter circuit with transistors Q5 and Q6 being a duplicate of the circuit 20.

The output of the composite transistor amplifier circuit 21 is taken from the common coupling of the collectors of transistors Q5 and Q6 through a coupling capacitor 30 to the base of a transistor amplifier Q7. The base of transistor Q7 is biased from a voltage divider circuit including the resistors 31, 32, 33, and 34 connected serially between a negative voltage source at terminal 35 and ground or fixed potential. The bias on the base of transistor Q7 comes from the juncture of resistors 31 and 32, and the juncture of resistors 32 and 33 is coupled to one plate of a capacitor 36, the opposite plate of which is coupled to the fixed or ground potential. The capacitor 36 constitutes a bandwidth control of the circuit. The junction of resistors 32 and 33 is coupled directly to the collector of transistor Q7 to provide collector voltage therefor and the emitter of transistor Q7 is coupled through an emitter load resistor 37 to ground potential. The collector of transistor Q7 is coupled directly to the base of an emitter follower transistor Q8, the emitter of which is coupled through a resistor 38 to the ground potential and the collector of which is coupled directly to a negative voltage source terminal at 39. The emitter output on conductor 40 constitutes the amplifier output.

The output 40 of the transistor amplifier is coupled by way of a branch conductor 41 through a feedback clamping circuit 42 and an output peak detector 43 to the base of transistor Q1 to feedback voltage from the output to the input of the amplifier to maintain good AGC of the amplifier. The feedback clamp consists of a capacitor 44 in series in the feedback loop 41 and a diode 45 having the anode thereof coupled to the output side of the coupling capacitor 44 and the cathode coupled to the fixed or ground potential. The output of the feedback clamp is coupled to the cathode of a rectifying diode 46 in the output peak detector 43, the anode of which is coupled in series with a resistor 47 to the base of transistor Q1. One plate of each of two capacitors 48 and 49 is coupled to opposite terminals of the resistor 47, the opposite plates of these capacitors 48 and 49 being coupled directly to the fixed or ground potential. The rectifying diode 46 converts the peak output voltage of the amplifier to a D.C. level which is smoothed or filtered by the resistor-capacitor combination 47, 48, 49. The input voltage signal A applied to input terminal 10 of the amplifier will be inverted, reinverted, and inverted again in passing through the transistor amplifier to the output 40, the emitter output on the conductor 40 providing an inverted voltage waveform B as shown on the branch conductor 41. The step voltage A will produce negative step voltages V1, V2, and V3 which, when conducted to the feedback clamp, will shift the voltage to produce the voltage waveform C on the output of the feedback clamp in which V1 will be subtracted from the voltage V2 as well as from the voltage V3. This voltage waveform C, when passed through the output peak detector 43, will produce a negative direct current voltage which will be applied to the variable impedance component of the voltage divider, or transistor Q1, to reduce the gain of the amplifier for decreased amplification of voltage input signals A; that is, the amplifier will be automatically gain controlled by controlling the gain inversely with amplification.

The output 40 of the amplifier is also conducted by branch conductor 50 through a coupling capacitor 51 to a clamped output circuit 52 which output 50 is conducted by way of the conductor means 53 to the data handling or logic circuits as necessary or required of the amplifier. The voltage on the output 53 is clamped as shown by the voltage waveform D to produce VA and VB voltage levels from the input voltage waveform A, this voltage being clamped to within a few millivolts of ground during the time interval defined by the lowest level of the input waveform A, so as to provide a zero reference for the tri-level signal D. The clamped output circuit includes transistors Q9 and Q10, the emitter of transistor Q9 being coupled to the output conductor 53 and the collector of this transistor being coupled directly to ground. The base of transistor Q9 is controlled from the collector of transistor Q10 through a resistor 55. The base bias of transistor Q9 is established by a positive voltage source applied at terminal 56 through a resistor 57. The collector voltage of transistor Q10 is applied from a negative voltage source at 58 through a resistor 59. The emitter of transistor Q10 is coupled directly to ground. The base of transistor Q10 is biased from a positive voltage source at 60 through a resistor 61. When it is desired to clamp the output waveform D to ground, a voltage may be applied to a clamping input terminal 62 through a resistor 63 to the base of transistor Q10. In this manner any step voltage as shown by the waveform A applied to input terminal 10 of the amplifier will produce step voltages VA and VB as shown by the waveform D on the output 53 at a clamped reference level produced by the clamped output circuitry 52. The amplifier will be automatically gain controlled through the feedback circuit 41, through the feedback clamp 42, and through the output peak detector 43 to the variable impedance element, being the transistor Q1 in the variable voltage divider circuit 12, 13, 14, and Q1 on the input of the amplifier.

Referring more particularly to FIGURE 2, a graph shows along the abscissa the input voltage in millivolts while the ordinate shows the output in volts. Also, the ordinate shows the amount of gain in numerical relation. An output voltage curve is shown with respect to a gain curve of the amplifier produced from a circuit constructed as that shown in FIGURE 1.

The AGC characteristics of an amplifier may be expressed in db in the following way in which P*in* is input power, P*o* is output power, E*in* is input voltage, E*o* is output voltage, R is resistance, and G is gain:

$$Pin=\frac{(Ein)^2}{R} \quad (1)$$

$$Po=\frac{(Eo)^2}{R} \quad (2)$$

Then;

$$\frac{Po}{Pin}=\frac{(Eo)^2}{(Ein)^2}=G^2 \quad (3)$$

And;

$$\text{db}=10\log\frac{Po}{Pin}=10\log\frac{(Eo)^2}{(Ein)^2}=10\log G^2 \quad (4)$$

But from Equation 4;

$$\text{db}=20\log\frac{Eo}{Ein}=20\log G \quad (5)$$

From this;

$$\Delta\text{db}=\text{AGC}_{\text{db}}=20\log G1-20\log G2 \quad (6)$$

Or;

$$\text{AGC}_{\text{db}}=20\log\frac{G1}{G2} \quad (7)$$

Using FIGURE 2 it can be found that;

$$\text{AGC}_{\text{db}}=20\log\frac{2667}{51.3}=20\log 51.98=(20)(1.7158)$$

Or;

$$\text{AGC}=34.3\text{ db}$$

Then, for example, if $$\Delta Ein=-60\text{ db}$$

And;

$$\Delta Eo_{\text{db}}=\Delta Ein_{\text{db}}+\text{AGC}_{\text{db}}$$

Then;

$$\Delta Eo_{\text{db}}=-60+34=-26\text{ db}$$

This graph shows that the amplifier yields 34 db of AGC with good linearity. The composite transistor circuits 20 and 21 used as the first two stages of the amplifier, each provide a high input impedance which was found necessary in order to obtain one percent linearity desired for the amplifier. It was found that the circuit of this invention has a sensitivity of 58 millivolts and a gain voltage of 68 db, also found necessary in amplifying step voltage signals necessary in the use of logic circuitry or data handling components of logic circuitry.

While many modifications and changes may be made in the constructional details and features of this invention to produce similar results for logic circuitry, I desire to be limited only in the spirit and scope of my invention by the limitations of the appended claims.

I claim:

1. A linear automatic gain controlled amplifier comprising:

a variable voltage divider circuit including a series of resistors and the emitter and collector electrodes of a transistor in series across a voltage, said transistor having a base electrode, and an input to said voltage divider being at the juncture of two of said series resistors to said emitter and with an output taken from said emitter;

an inverting amplifier having an input coupled to the output of said voltage divider and an output to provide inverted amplified voltage signals therefrom;

an output clamping circuit coupled to said amplifier output to provide the amplified voltage at a clamped reference voltage level adaptable for output circuitry; and a feedback circuit coupling the output of said amplifier with the base electrode of said transistor in said voltage divider, said feedback circuit including a feedback clamp and a peak detector in that order from said amplifier output to said base electrode whereby the feedback voltage controls the impedance of said transistor to control the gain to said amplifier inversely to amplification.

2. A linear automatic gain controlled amplifier as set forth in claim 1 wherein the amplifier includes a plurality of cascaded transistor stages, each stage having a pair of transistors with the collectors coupled in common, the base of one transistor constituting an input, the emitter of said one transistor and the base of the other transistor of said pair being coupled in common, the collector of said other transistor constituting the output of said amplifier stage, and the input of the first stage being coupled to the emitter output of said variable voltage divider to provide a high input impedance and to obtain good linearity of the voltage signals amplified thereby.

3. A linear automatic gain controlled amplifier as set forth in claim 1 wherein said feedback clamp consists of a capacitor in series with the feedback circuit followed by the coupling of the anode of a diode to the feedback circuit with the cathode of said diode being coupled to a reference potential constituting the clamping voltage level, and wherein said peak detector consists of a diode and a resistance in series in said feedback circuit with one plate of each of two capacitors coupled at opposite terminals of said resistance with the opposite plates of the capacitors coupled to a fixed potential.

4. A linear automatic gain controlled amplifier as set forth in claim 3 wherein said amplifier includes a final stage of a transistor and an emitter follower, the emitter of said emitter follower constiuting said amplifier output.

5. A linear automatic gain controlled amplifier as set forth in claim 4 wherein said cascaded transistor stages in said amplifier each have a decoupling network connected thereto.

6. A linear automatic gain control amplifier comprising:

a variable voltage divider circuit consisting of a series of resistors and an electron emission means having conduction electrodes in series with said series resistors and having a control electrode biased to a predetermined voltage level, said voltage divider having an input at the junction of two of said series resistors to receive voltage signals, and a voltage output from one of said conduction electrodes of said electron emission means to conduct said voltage signals with a gain established by the voltage on said control electrode;

an inverting amplifier having an input coupled to the output of said voltage divider circuit and an output to provide inverted, amplified voltage signals therefrom; and a feedback circuit having a voltage clamping network to clamp the inverted signal voltage amplitude in one polarity and a peak detector to provide direct current voltage of the other polarity opposite to said control electrode bias of said electron emission means, in that order from said amplifier output to said control electrode to feed back direct current control voltage on said control electrode to control the impedance of said electron emission means to reduce the gain of the amplifier inversely proportional to the increase in amplitude of the input signals.

References Cited by the Examiner

UNITED STATES PATENTS

| | | | |
|---|---|---|---|
| 2,288,434 | 6/1942 | Bradley | 330—141 X |
| 2,866,015 | 12/1958 | Sailor | 330—138 X |
| 2,929,998 | 3/1960 | Diehl | 330—22 |
| 2,979,667 | 4/1961 | Paschal | 330—29 X |
| 3,015,782 | 1/1962 | Pihl | 330—145 |
| 3,117,287 | 1/1964 | Damico | 330—29 X |
| 3,145,263 | 8/1964 | Barnard | 178—7.3 |
| 3,189,841 | 5/1965 | Druz | 330—29 |
| 3,215,940 | 11/1965 | Fisher | 330—29 X |

NATHAN KAUFMAN, *Primary Examiner.*

ROY LAKE, *Examiner.*

J. B. MULLINS, *Assistant Examiner.*